(12) United States Patent
Lee

(10) Patent No.: US 9,337,227 B2
(45) Date of Patent: May 10, 2016

(54) MULTI-SUBSTRATE IMAGE SENSOR HAVING A DUAL DETECTION FUNCTION

(75) Inventor: Do Young Lee, Seongnam-si (KR)

(73) Assignee: SiliconeFile Technologies Inc., Gyeonggi-do (KR)

( * ) Notice: Subject to any disclaimer, the term of this patent is extended or adjusted under 35 U.S.C. 154(b) by 0 days.

(21) Appl. No.: 14/237,853

(22) PCT Filed: Aug. 8, 2012

(86) PCT No.: PCT/KR2012/006293
§ 371 (c)(1),
(2), (4) Date: Feb. 7, 2014

(87) PCT Pub. No.: WO2013/022269
PCT Pub. Date: Feb. 14, 2013

(65) Prior Publication Data
US 2014/0191357 A1 Jul. 10, 2014

(30) Foreign Application Priority Data
Aug. 8, 2011 (KR) .......................... 10-2011-0078512

(51) Int. Cl.
*H01L 27/146* (2006.01)
*H04N 5/3745* (2011.01)
(Continued)

(52) U.S. Cl.
CPC ...... *H01L 27/14634* (2013.01); *H01L 27/1464* (2013.01); *H01L 27/14638* (2013.01); *H04N 5/3745* (2013.01); *H04N 5/37457* (2013.01); *H04N 9/045* (2013.01); *H04N 13/0239* (2013.01); *H01L 27/14621* (2013.01);
(Continued)

(58) Field of Classification Search
CPC .................. H01L 27/14634; H01L 27/14643; H01L 27/14636; H01L 27/14621; H01L 27/14627; H04N 5/37457
USPC .................. 257/292, 401, 431, 616, 618, 461
See application file for complete search history.

(56) References Cited

U.S. PATENT DOCUMENTS 7,893,468 B2    2/2011   Gambino et al.
2009/0200589 A1    8/2009   Qian et al.
(Continued)

FOREIGN PATENT DOCUMENTS

| KR | 10-2006-0108378 | 10/2006 |
| KR | 10-2007-0083300 | 8/2007 |
| KR | 10-0835892 | 6/2008 |

(Continued)

OTHER PUBLICATIONS

International Search Report for International Application No. PCT/KR2012/006293, dated Feb. 26, 2013.
(Continued)

*Primary Examiner* — Evan Pert
*Assistant Examiner* — Changhyun Yi
(74) *Attorney, Agent, or Firm* — IP & T Group LLP

(57) ABSTRACT

The present invention relates to an image sensor in which substrates are stacked, wherein a substrate-stacked image sensor according to the present invention is configured such that a first photodiode is formed on a first substrate, a second photodiode is formed on a second substrate, the two substrates are aligned with and bonded to each other to electrically couple the two photodiodes to each other, thereby forming a complete photodiode within one pixel.

10 Claims, 5 Drawing Sheets

(51) Int. Cl.
*H04N 9/04* (2006.01)
*H04N 13/02* (2006.01)

(52) U.S. Cl.
CPC ..... *H01L27/14627* (2013.01); *H01L 27/14636* (2013.01); *H01L 27/14643* (2013.01)

(56) References Cited

U.S. PATENT DOCUMENTS

| | | | | |
|---|---|---|---|---|
| 2009/0294813 | A1* | 12/2009 | Gambino et al. | 257/292 |
| 2010/0026865 | A1 | 2/2010 | Tivarus et al. | |

FOREIGN PATENT DOCUMENTS

| | | |
|---|---|---|
| KR | 10-2010-0076261 | 7/2010 |
| KR | 10-2010-0112852 | 10/2010 |
| KR | 10-2011-0069889 | 6/2011 |
| KR | 10-2011-0096275 | 8/2011 |
| KR | 10-2011-0126891 | 11/2011 |
| KR | 10-2011-0134139 | 12/2011 |

OTHER PUBLICATIONS

Search Report issued by the European Patent Office on Jun. 16, 2015.

* cited by examiner

MULTI-SUBSTRATE IMAGE SENSOR HAVING A DUAL DETECTION FUNCTION

BACKGROUND OF THE INVENTION

1. Technical Field

The present invention relates to a substrate stacked image sensor wherein a pixel is completed by forming partial configurations of an image sensor pixel on mutually different substrates, respectively, and three-dimensionally stacking and bonding the substrates; and more particularly, to a substrate-stacked image sensor having a dual detection function wherein a first photodiode is disposed on a first substrate, a second photodiode is disposed on a second substrate, and the first photodiode and the second photodiode are coupled to form a complete photodiode as a configuration element of one pixel when the substrates are stacked and coupled to each other, and wherein the substrate-stacked image sensor can be controlled to selectively read or aggregately read signals individually detected by the respective photodiodes, as necessary.

2. Background Art

Background art may be described from two points of view. One is from the viewpoint of stacking of a semiconductor integrated circuit, and the other is from the viewpoint of miniaturization of an image sensor.

Hereinafter, the conventional techniques on stacking of a semiconductor integrated circuit will be described. As semiconductor integrated circuits are continuously miniaturized, packaging techniques for semiconductor integrated circuits have also been continuously developed to satisfy demands for miniaturization and mounting reliability thereof. Recently, various techniques have been developed for substrate stacking with a three-dimensional (3D) structure in which two or more semiconductor chips or semiconductor packages are vertically stacked.

A three-dimensional (3D) structure element using such substrate stacking is manufactured in such a manner that, after substrates are stacked, the stacked substrates are subjected to a thinning process of grinding the rear surface thereof to reduce the thickness thereof, are subjected to the following processes, are subjected to a sawing process, and then are packaged.

There are very many conventional techniques for stacking substrates in various fields. The present applicant has also tried to develop various techniques. For example, a method for achieving more economic manufacture by omitting an etching process after bonding and stacking substrates is filed by the present applicant and assigned in Korean Patent Application No. 2010-0015632 (Feb. 2, 2010).

In addition, a technique for minimizing the misalignment of bonding pads on the respective substrates when the substrates are bonded with each other is filed by the present applicant and assigned in Korean Patent Application No. 2010-0046400 (May 18, 2010).

In addition, a manufacturing method in which pads are more protruded on the respective substrates in order to facilitate bonding when stacking the substrates is also disclosed in Korean Patent Application No. 2010-53959 (Jun. 8, 2010) granted to the present applicant.

Considering the prior art from the viewpoint of miniaturization of an image sensor, with the development of mobile devices such as portable phones, it is necessary for a camera module built therein to have a lower height and for an image sensor included in a camera module to have a higher resolution in order to increase design flexibility in the mobile devices. By such a tendency, the size of pixels in an image sensor has also continuously decreased.

Recently, with the development of the semiconductor integrated circuit technology, pixels have been able to be manufactured to have a size of approximately 1.4 µm×1.4 µm which approximates to the wavelength band of visible light. Accordingly, in the case of the conventional front side illumination (FSI) scheme, a phenomenon in which light incidented from an exterior is not sufficiently concentrated to a photodiode due to obstacle of metal wirings disposed on the pixels significantly occurs. In order to solve such a problem, an image sensor using a back side illumination (BSI) scheme in which a photodiode is disposed as near as possible to an incident direction of light has been highlighted.

FIG. 1 is a view schematically illustrating an image sensor using the BSI scheme described above, wherein four unit pixels constituted by red, green, and blue color filters 11, 21, 31 and 41, and by photodiodes 12, 22, 32 and 42 are shown in three dimensions. FIG. 2 is a view separating and illustrating only a red pixel from among the pixels. It should be noted that FIGS. 1 to 3 show an embodiment for only a color filter part of pixels included in an image sensor and only a photodiode part formed on a semiconductor substrate.

With the continuous development of the semiconductor technology, the pixels in an image sensor using a BSI scheme have been smaller to a degree that the width thereof is 1.1 µm while the depth thereof is 3 to 5 µm, as shown in FIG. 2, which makes it possible to integrate more pixels per unit area. In this case, a signal disturbance phenomenon, which was not serious before, is raised as a new problem.

Such a problem will be described in more detail with reference to FIG. 3, which is a cross-sectional view of two pixels which are successively disposed. In FIG. 3, light incidented through a green color filter 21 generates photoelectrons in a corresponding photodiode 22. Most of the photoelectrons are normally captured in the depletion region (a portion shown as a dotted line in FIG. 3) of the photodiode 22 connected to the green color filter 21, and become useful current components. However, a part of the photoelectrons cross over into a photodiode 12 of an adjacent pixel, wherein as the width of the photodiodes 12 and 22 are narrower, the amount of photoelectrons crossing over into the photodiode 12 increases. Such photoelectrons are signal losses from the viewpoint of the photodiode 22 connected to the green color filter 21, and are unnecessary signals, i.e. color noise, from the viewpoint of the photodiode 12 connected to the red color filter 11. This is called a cross-talk phenomenon. Consequently, in pixels that the width thereof is as narrow as 1.1 µm while the depth thereof reaches 3 to 5 µm, the cross-talk phenomenon becomes serious, so that the advantage of the BSI scheme does not appear any more.

In a state where pixels have a size (i.e. interval) of 1.1 µm, a substrate may be manufactured to be thin to a thickness of a half or less (e.g. from 4 µm to 2 µm) in order to reduce the cross-talk phenomenon. However, in this case, incident light is not sufficiently absorbed by a silicon photodiode, and a transmittance of passing through the photodiode increases. That is to say, the quantum efficiency (QE) decreases to reduce the amplitude of an electric signal. Here, the quantum efficiency (QE) means a ratio between incident light, i.e. incident photons, and electric charges generated/captured therefrom, and is an index representing how much efficiently light signals are converted into electric signals by an image sensor.

Also, in the conventional back side illumination-type image sensor, the thickness thereof may be reduced in order to reduce the cross-talk phenomenon. However, in this case, it has been well known that: green light is partially absorbed by the photodiode of a first substrate although blue light is mostly absorbed by the photodiode; and red light is absorbed by a smaller amount than the green light although the red light also is partially absorbed. In addition, infrared light shows a tendency to be absorbed by a smaller amount than the red light.

Consequently, absorbing light means that photons have been converted into electric charges. Thus, the problem that the quantum efficiency (QE) is lower in the order of blue light, green light, red light and infrared light becomes larger in the back side illumination-type image sensor. In addition, the components of non-absorbed light are absorbed by other parts, except for photodiodes, are scattered after a collision with metal wirings, or are transmitted deep into stacked substrates, so that light is wasted regardless of the quantum efficiency.

DISCLOSURE

Technical Problem

Accordingly, the present invention has been made in an effort to solve the problems occurring in the related art, and an object of the present invention is to provide a substrate-stacked image sensor having a dual detection function which does not cause a cross talk while having a high quantum efficiency.

Another object of the present invention is to provide a substrate-stacked image sensor having a function of doubly detecting incident light by: disposing a first photodiode on a first substrate; disposing a second photodiode on a second substrate; and coupling the first photodiode and the second photodiode to each other at the same time as the substrates are coupled to each other so as to be a complete photodiode as a component of one pixel.

The object of the present invention is not limited to the aforementioned objects. Other objects and advantages of the present invention will be more apparent from the following description.

Technical Solution

In order to achieve the above object, according to one aspect of the present invention, there is provided a substrate-stacked image sensor having a dual detection function, the sensor comprising: a first photodiode formed on a first substrate; and a second photodiode formed on a second substrate, wherein the first photodiode and the second photodiode are in electric contact with each other.

According to another aspect of the present invention, there is provided a substrate-stacked image sensor having a dual detection function, the sensor comprising: a first photodiode and a first pad formed on a first substrate; and a second photodiode and a second pad formed on a second substrate, wherein the first photodiode and the second photodiode are electrically coupled to each other by contact of the first pad and the second pad.

According to still another aspect of the present invention, there is provided a substrate-stacked image sensor having a dual detection function, the sensor comprising: a first photodiode and a first transfer transistor formed on a first substrate; and a second photodiode and a second transfer transistor formed on a second substrate, wherein the first photodiode, the second photodiode, the first transfer transistor, and the second transfer transistor are in electric contact with each other.

According to still another aspect of the present invention, there is provided a substrate-stacked image sensor having a dual detection function, the sensor comprising: a first photodiode and a first transfer transistor formed on a first substrate; and a second photodiode formed on a second substrate, wherein the first photodiode and the second photodiode are in electric contact with each other.

According to still another aspect of the present invention, there is provided a substrate-stacked image sensor having a dual detection function, the sensor comprising: a first photodiode formed on a first substrate; and a second photodiode and a second transfer transistor formed on a second substrate, wherein the first photodiode and the second photodiode are in electric contact with each other.

Advantageous Effects

According to the configurations of the substrate-stacked image sensors in accordance with the embodiments of the present invention, most of blue light, a part of green light and a part of red light are absorbed by a first photodiode of a first substrate; and an extremely small part of the blue light, the residual part of the green light, the residual part of the red light, and infrared light are absorbed by a second photodiode of a second substrate for the second time, so that the quantum efficiency increases, and waste of incident light is minimized.

According to the embodiments of the present invention, since two photodiodes of upper and lower substrates are positioned at physically different distances from an external optical system (i.e. an external lens), a relative distance of a subject finally captured as an image can be measured through: the chromatism of the respective three colors (i.e. green, blue and red) which the external lens has; the analysis of frequency components of a captured image on the respective three colors of the upper substrate; and the analysis of frequency components of a captured image on the respective three colors of the lower substrate, so that basic image data to restore a three-dimensional image can be produced.

The present invention can be utilized to generate a three-dimensional image in a scheme which is entirely different from that used in the conventional stereo camera to generate a three-dimensional image.

BRIEF DESCRIPTION OF THE DRAWINGS

The above objects, and other features and advantages of the present invention will become more apparent after a reading of the following detailed description taken in conjunction with the drawings, in which.

BEST MODE FOR THE INVENTION

Figure 1:
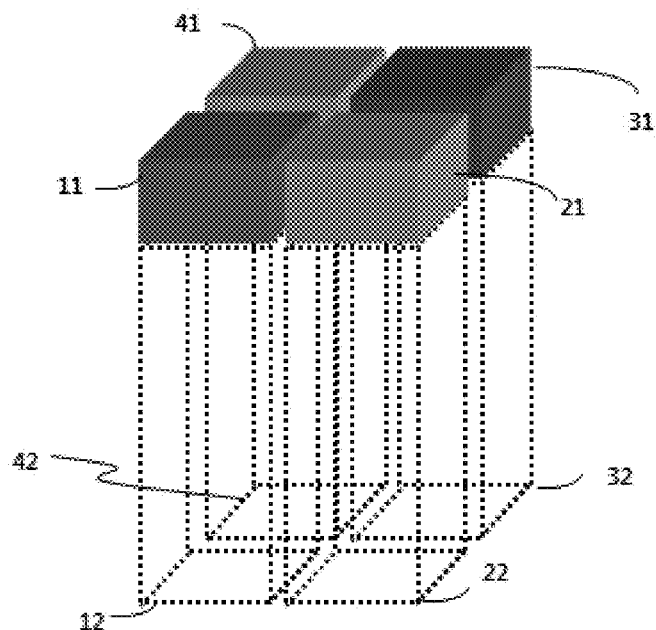
FIG. 1 is a view illustrating a cross-section of pixels of an image sensor in three dimensions.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 4:
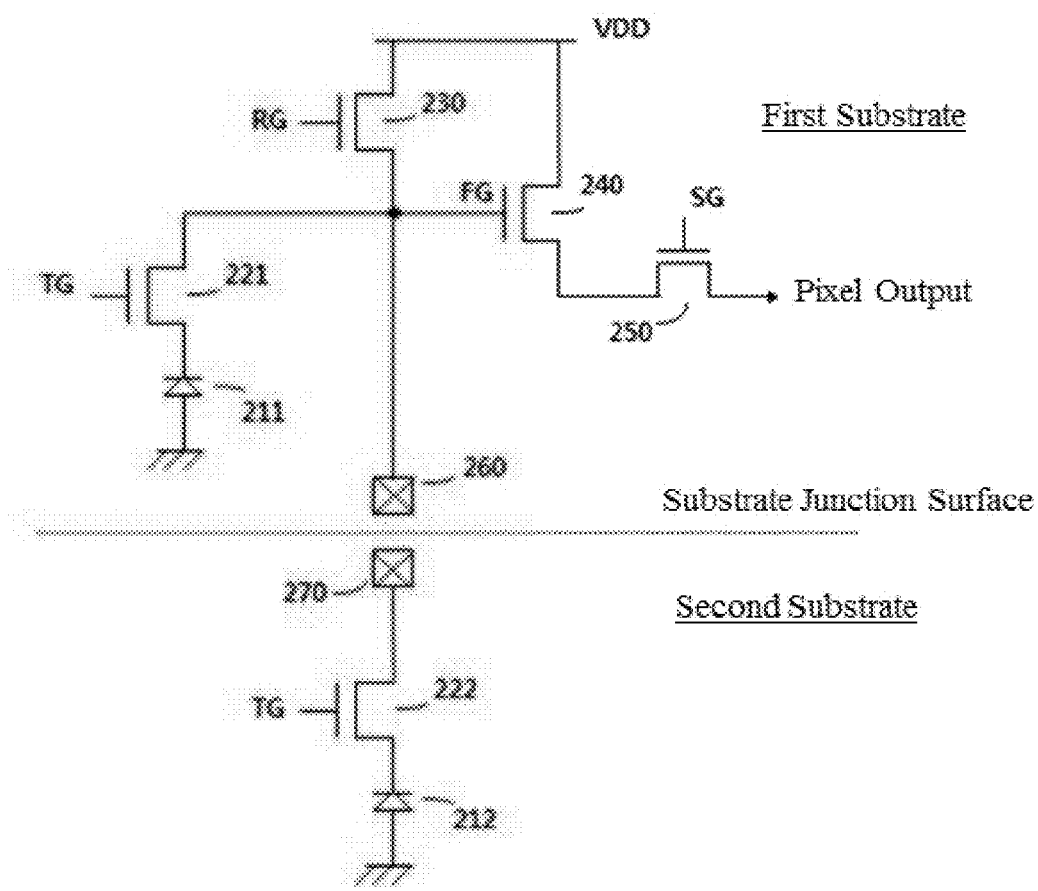
FIG. 4 is a circuit diagram schematically illustrating the configuration of a substrate-stacked image sensor according to an embodiment of the present invention.

FIG. 4 is a circuit diagram illustrating the technical idea of the present invention according to an embodiment of the present invention. For convenience of description, it is assumed that one pixel includes one photodiode and four transistors. According to circumstances, one pixel may be constituted by one diode and three transistors. However, the number of transistors has no connection with the main idea of the present invention. Although a pixel includes several transistors, the characteristics of the present invention can be identically implemented.

A second substrate has a second photodiode 212, a second transfer transistor 222, and a second pad 270. A first substrate has a first photodiode 211, a first transfer transistor 221, a reset transistor 230, a following transistor 240, a selection transistor 250, and a first pad 260.

The first transfer transistor 221, the second transfer transistor 222, the reset transistor 230, the following transistor 240, and the selection transistor 250 function to output an electric signal converted by photodiodes as an output of a pixel, so that the transistors will be inclusively designated as "access transistors".

Elements formed on the first substrate and elements formed on the second substrate are respectively manufactured by a well-known semiconductor manufacturing process, and then the two substrates are bonded with one of the two substrates turned over. In this case, the first pad and the second pad must be accurately aligned so as not to be out of line with each other.

The main feature of the present invention is to form the first photodiode on the first substrate, to form the second photodiode on the second substrate, and then to electrically combine the first photodiode and second photodiode into one when bonding the substrates.

The first transfer transistor 221 and the second transfer transistor 222 are also arranged on the two substrates, and are electrically combined into one when the substrates are bonded. Here, "the combination of transistors" means that the gate node and drain node of one transistor are short-circuited to the gate node and drain node of the other transistor, respectively. Naturally, it means that a gate node signal TG for the respective transistors is applied in common. Thus, by such combination, the current driving capability also increases by a width/length (W/L) ratio of each transistor. In addition, naturally, a circuit designer may preset the width/length (W/L) ratio of each transistor in consideration of the fact that the driving capability thereof increases by combination.

Also, in order to selectively control the first transfer transistor 221 and the second transfer transistor 222 according to necessity, gate node signals TG may be individually separated and controlled.

The area which the first photodiode 211 occupies in the first substrate may be different from the area which the second photodiode 212 occupies in the second substrate. This is because not only the second photodiode 212 but also the other access transistors must be disposed on the same plane within a limited pixel area of the second substrate. Therefore, a pitch between some elements of a unit pixel formed on the first substrate is accurately identical to a pitch between the other elements of the unit pixel formed on the second substrate.

Figure 5:
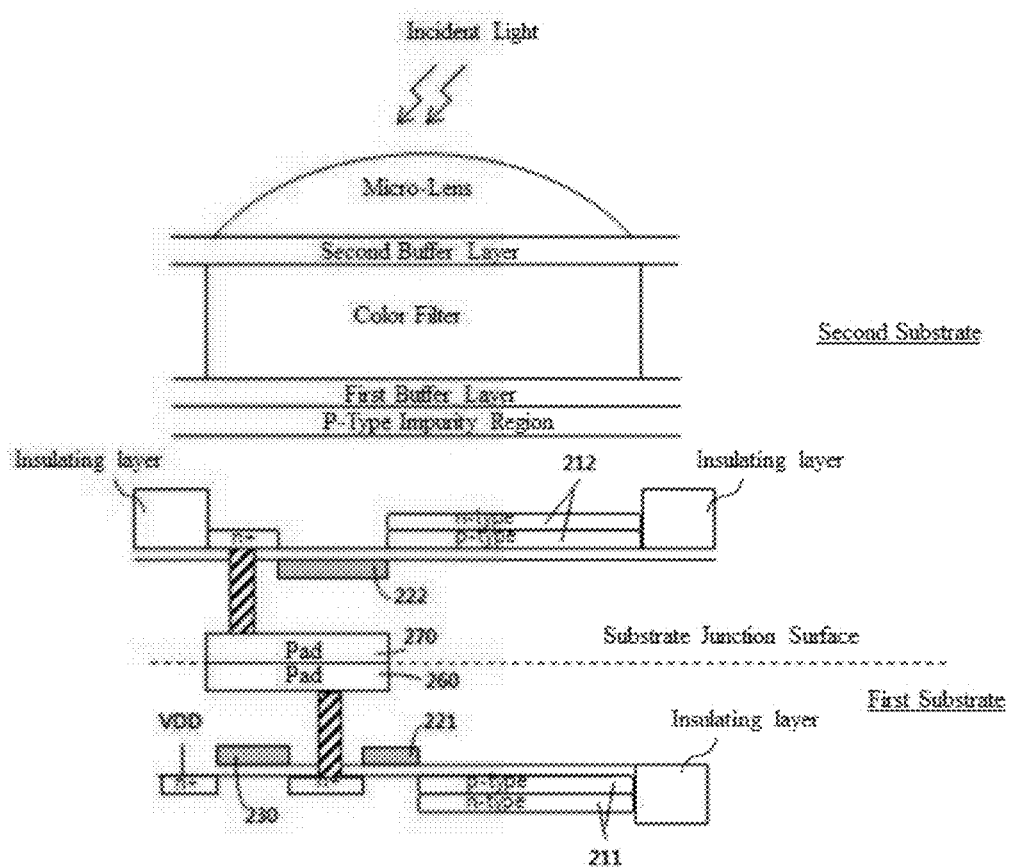
FIG. 5 is a cross-sectional view illustrating a semiconductor substrate in which the circuit diagram shown in FIG. 4 has been implemented.

Hereinafter, one embodiment of the present invention will be described in detail from another viewpoint with reference to the cross-sectional view of FIG. 5.

Naturally, color filters for individually separating blue light, green light and red light are individually configured. FIG. 5 representatively illustrates only a pixel corresponding to one of blue, green and red (BGR), which are three primary colors.

Light incidented to an image sensor is incidented generally from the rear surface of the second substrate, is concentrated by a micro-lens, is individually selected by a color filter via a second buffer layer, passes through a first buffer layer, a P-type impurity region, and the like, and then arrives at a P-N junction region, which is a second photodiode 212. The order of the micro-lens, the second buffer layer, the first buffer layer, and the p-type impurity region are normal, and is not the main feature of the present invention, so a detailed description thereof will be omitted. It should be noted that the second substrate is disposed on the first substrate in the cross-sectional view of FIG. 5.

In this case, most of the selected light when the light is blue light, a part of the selected light when the light is green light, and a part of the selected light when the light is red light are absorbed into the second photodiode 212, and are converted into photoelectrons.

Although a part of the remaining light which has not been absorbed into the second photodiode is scattered by metal wirings, which are not shown, the other part of the remaining light is continuously transmitted to sufficiently arrive at the first photodiode 211. Accordingly, an extremely small part of remaining blue light, a part of remaining green light, and a part of remaining red light are converted into photoelectrons by the first photodiode 211 for the second time. That is to say, detection of light is doubly performed. Especially, in the case of infrared light, photoelectrons converted by the first photodiode 211 may be more than those converted by the second photodiode 212 due to the high transmittance of the infrared light.

As described above, the P-N junction region of the second photodiode 212 is wider than that of the first photodiode 211. This is because most access transistors must be additionally disposed on the first substrate while the first substrate and the second substrate must have the same pixel area. FIG. 5 illustrates only the first transfer transistor 221 on the first substrate for convenience sake, which is because all the access transistors may not be shown in one cross-section due to the disposition thereof although all the access transistors exist on the same plane.

If most of the access transistors are disposed on the second substrate, the P-N junction region of the second photodiode 212 may be narrower than the P-N junction region of the first substrate, which is one of various features shown in present invention.

Figure 2:
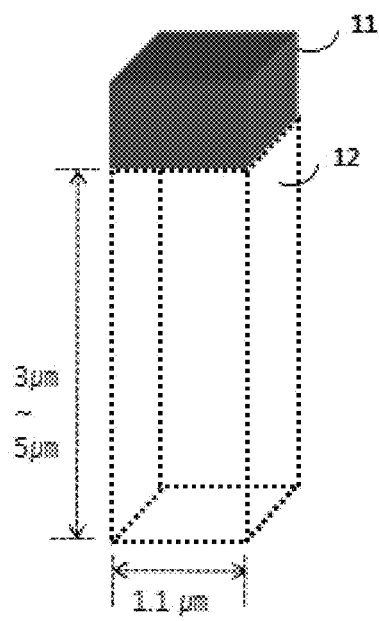
FIG. 2 is a view illustrating one pixel which is selected from FIG. 1, and the size of which is expressed.
Figure 3:
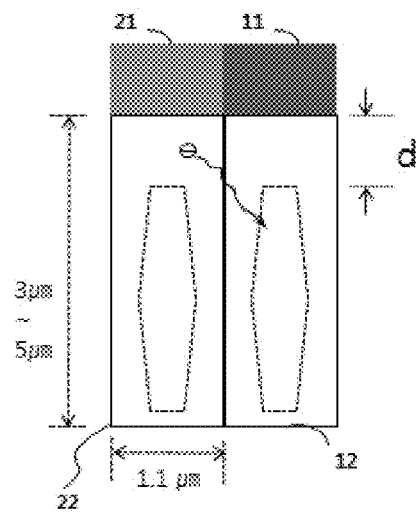
FIG. 3 is a view explaining a cross-talk phenomenon.
Figure 6:
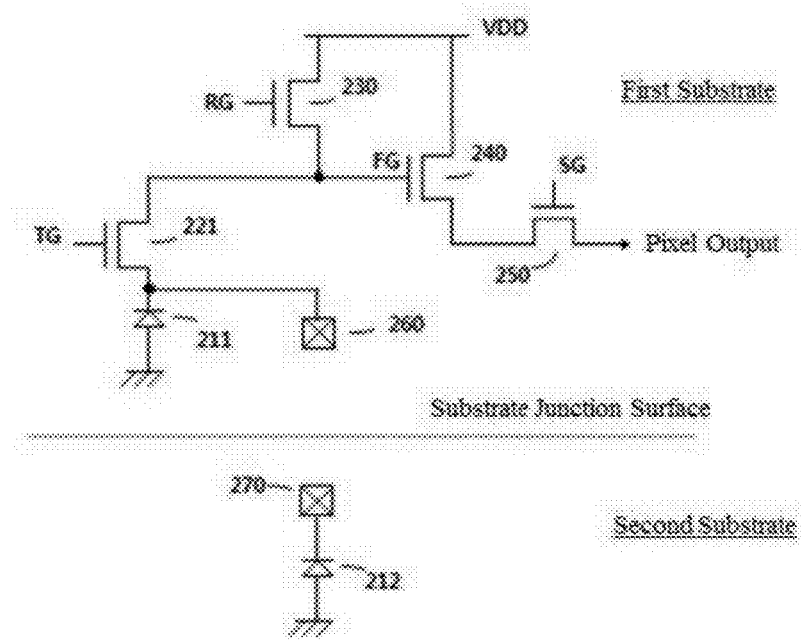
FIG. 6 is a circuit diagram schematically illustrating the configuration of a substrate-stacked image sensor according to another embodiment of the present invention.

FIG. 6 is a circuit diagram schematically showing another embodiment of the present invention. The embodiment shown in FIG. 6 is the same as that shown in FIG. 4 except that a second transfer transistor does not exist, and only the second photodiode 212 and second pad 270 exist on the second substrate. Since only one transfer transistor 221 exists, it is impossible to select one of the first and second photodiodes 211 and 212, unlike the embodiment shown in FIG. 2. According to the embodiment, only a photodiode can be disposed on the second substrate, without a transfer transistor and wirings for the transfer transistor, so that the area of the photodiode can be maximized.

Figure 7:
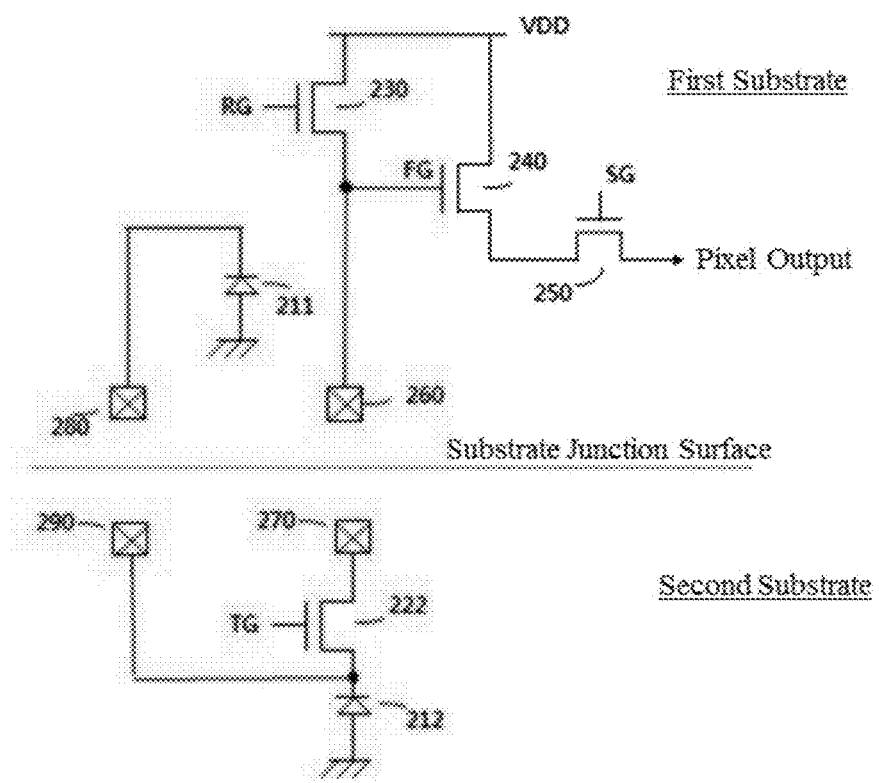
FIG. 7 is a circuit diagram schematically illustrating the configuration of a substrate-stacked image sensor according to still another embodiment of the present invention.

FIG. 7 is a circuit diagram schematically showing still another embodiment of the present invention. Referring to FIG. 7, the first transfer transistor does not exist on a first substrate. It should be noted that two pads 280 and 290 are added for the electrical connections of the first photodiode 211 and second photodiode 212. Since the embodiment also includes only one transfer transistor 222, it is impossible to select one of the first and second photodiodes 211 and 212, unlike the embodiment shown in FIG. 4. According to the embodiment, a transfer transistor and wirings for the transfer transistor are not required on the first substrate, and thus the area for the first photodiode can increase.

Since a person skilled in the art can easily derive the cross-section views corresponding to FIGS. 6 and 7, the cross-section views thereof will be omitted. The same reference numerals as used in FIG. 4 are used in FIGS. 6 and 7 so that it can be easily understood that the same reference numerals represent the same constituent elements.

Figure 8:
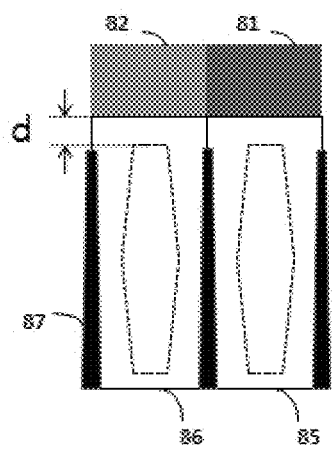
FIG. 8 is a view illustrating a trench formed between the respective photodiodes according to an embodiment of the present invention.

FIG. 8 illustrates a case where a trench 87 is formed between the respective pixels in at least one of the first and second photodiodes according to the embodiments of the present invention, and the trench 87 is filled with impermeable material. Accordingly, photoelectrons generated by passing through color filters 81 and 82 stay only in the insides of the respective photodiodes 85 and 86, and can be prevented from crossing over into an adjacent photodiode. That is to say, the cross-talk phenomenon between pixels can be reduced.

Although a preferred embodiment of the present invention has been described for illustrative purposes, those skilled in the art will appreciate that various modifications, additions and substitutions are possible, without departing from the scope and the spirit of the invention as disclosed in the accompanying claims.

The invention claimed is:

1. A multi-substrate image sensor having a dual detection function, the sensor comprising:

a first photodiode and a first pad formed on a first substrate; and a second photodiode and a second pad formed on a second substrate, wherein the first pad and the second pad are in direct physical contact to electrically couple the first photodiode and the second photodiode.

2. The image sensor according to claim 1, wherein the first substrate and the second substrate are made of silicon (Si), germanium (Ge), or gallium arsenic (GaAs).

3. The image sensor according to claim 1, wherein, on the second substrate, the entire or a part of access transistors are formed.

4. The image sensor according to claim 1, wherein a transfer transistor is selectively formed on only one of the first and second substrates.

5. The image sensor according to claim 1, wherein a first transfer transistor of access transistors is formed on the first substrate, and a second transfer transistor thereof is formed on the second substrate.

6. The image sensor according to claim 1, wherein the first photodiode and the second photodiode are integrated by the contact to produce one complete photodiode in one pixel.

7. The image sensor according to claim 1, wherein the first photodiode and the second photodiode are different from each other in sizes of P-N junctions thereof.

8. The image sensor according to claim 1, wherein at least one of the first and second photodiodes has a trench formed on a periphery thereof.

9. The image sensor according to claim 8, wherein the trench is filled with impermeable material.

10. The image sensor according to claim 1, wherein the first photodiode is a back illuminated structure (BSI) and the second photodiode is a front illuminated structure (FSI).

* * * * *